United States Patent [19]
Yu et al.

[11] Patent Number: 5,666,310
[45] Date of Patent: Sep. 9, 1997

[54] HIGH-SPEED SENSE AMPLIFIER HAVING VARIABLE CURRENT LEVEL TRIP POINT

[75] Inventors: Donald Yuen Yu, Fremont, Calif.; Jeffrey Scott Hunt, Ackerman, Miss.; Satish Chandra Saripella; William Randolph Hiltpold, both of Starkville, Miss.

[73] Assignee: Cypress Semiconductor, San Jose, Calif.

[21] Appl. No.: 593,974

[22] Filed: Jan. 30, 1996

[51] Int. Cl.⁶ .................. G11C 11/34; G11C 7/00
[52] U.S. Cl. .................. 365/185.21; 365/185.22; 365/185.33; 327/51
[58] Field of Search .................. 365/185.21, 185.22, 365/185.33; 327/51

[56] References Cited

U.S. PATENT DOCUMENTS

| | | | |
|---|---|---|---|
| 4,774,421 | 9/1988 | Hartman et al. | 365/185.22 |
| 4,833,646 | 5/1989 | Turner | 365/185.22 |
| 4,851,720 | 7/1989 | Pathak et al. | 365/185.21 |
| 5,105,388 | 4/1992 | Itano et al. | 365/185.22 |
| 5,561,629 | 10/1996 | Curd | 365/185.21 |

*Primary Examiner*—David C. Nelms
*Assistant Examiner*—Trong Quang Phan
*Attorney, Agent, or Firm*—Dykema Gossett PLLC

[57] ABSTRACT

An improved high-speed sense amplifier is disclosed for use in programmable logic devices (PLDs) and complex PLDs. The sense amplifier includes a transresistance amplifier portion that provides a voltage potential to a first node of a memory array, which defines a read product term line. The current drawn by the memory array will cause the output of the amplifier to change states once a predetermined current level is reached, the predetermined trip point indicating that at least one memory cell is conducting. The amplifier includes an n-channel MOS transistor having its drain connected between a second node of the memory array, and its source to ground. The gate of the n-channel transistor is connected to the read product line. The n-channel limits current through the memory array by raising the potential at the second node, thus reducing the voltage drop across the memory array. The sense amplifier also includes a depletion MOS transistor having its drain connected to the read product term line, its source to ground, and its gate to the drain of the n-channel transistor. As branches of the memory cell become conductive, the voltage of the drain of the n-channel transistor rises, which biases the depletion transistor on, drawing current from the sense amplifier. This extra current eliminates the "strong zero" to "weak zero" glitch that can occur when many conducting legs change to a single conducting leg.

13 Claims, 1 Drawing Sheet

HIGH-SPEED SENSE AMPLIFIER HAVING VARIABLE CURRENT LEVEL TRIP POINT

BACKGROUND OF THE INVENTION

1. Field of the Invention

The present invention relates generally to a high-speed sense amplifier for use in programmable logic devices (PLD), and more particularly, to such a sense amplifier having a variable current level trip point.

2. Description of the Related Art

Dynamic random access memory (DRAM) and static random access memory (SRAM), directly store different voltage levels (e.g., via a storage capacitor in a DRAM) corresponding to the stored logic states. Non-volatile semiconductor memory cells, however, store data by having two different current levels through the cell, and "ON" cell current level, and an "OFF" cell current level. When such non-volatile memory cells are used in a logic device, the different cell currents must be translated or converted by a sense amplifier for output of a signal indicative of the state of the stored data.

As further background, and referring now to FIG. 1, a programmable logic device (PLD) 10 is shown and which includes a memory array 12, and a sense amplifier 14. Those skilled in the art will recognize the well-known purpose and function of the input terms IT1, . . . , ITN and the read product term, particularly as used in a PLD or complex PLD. Memory 12 and sense amplifier 14 are coupled together by a read product term (RPT) line 16, and a verify (VRFY) line 18, which also serves as a virtual ground line 18. The memory array 12 is of the type having non-volatile memory cells $M_1, \ldots, M_n$, and select gates $N_1, \ldots, N_n$ connected in series. In particular, the memory cells $M_i$ include a respective floating gate $20_1, \ldots, 20_n$. As is well-known in the art, when the floating gate has been programmed, the particular memory cell so programmed will not conduct upon application of a gate voltage VREF1. However, when the floating gate is not programmed, the memory cell will conduct, and will carry current. Moreover, each one of the plurality of select gates has an input term IT1, . . . , ITN applied to a respective gate terminal. Thus, when a memory element $M_i$ is programmed to be conductive, and the series-connected select gate is turned-on by application of an appropriate input term, the "branch" or "leg" so formed may carry current between the RPT line, and the virtual ground. Many branches are disposed in parallel between the RPT line and the virtual ground line to generate a product term.

Sense amplifier 14 includes a first stage 22, and second stage 24. The first stage 22 is included for providing a substantially constant voltage potential on the RPT line, and for sensing whether current is being drawn through any one of the plurality of branches formed in memory array 12. The sensing is accomplished by way of feedback circuits. In one embodiment of sense amplifier 14, the amplified signal at the output of first stage 22 has a swing of approximately 1 volt. Second stage 24 then further converts this signal to full CMOS levels.

In operation, the sense amplifier output (SAOUT) is normally high when none of the plurality of branches in memory array 12 are conductive. When one or more of the branches of memory array 12 become conductive, the current drawn through memory 12 via the RPT line, causes the sense amplifier 14 to "trip," thus causing the sense amplifier output to assume a low state. Current limiting transistor 26 is provided to limit the total current through memory array 12 by elevating the voltage potential of virtual ground line 18 according to the amount of current being carried through the plurality of branches. Specifically, as more branches in memory array 12 become conductive, the current flowing through the channel of current limiting transistor 26 causes the drain terminal of the transistor (which is connected to virtual ground line 18) to rise. The rise in the voltage potential of virtual ground line 18, relative to the voltage on RPT line 16, causes the voltage drop across the memory array to be reduced. This reduction in voltage differential reduces the aggregate current flow through the conductive branches.

The circuit shown in FIG. 1, however, can produce incorrect and inconsistent results (i.e., a "glitch") under certain, transient switching conditions. One example of a such a condition is a so-called "strong zero" to "weak zero" glitch. A "strong zero" is when many branches are conductive, which causes SAOUT to go low or be a zero. A "weak zero" is when only one branch is conductive, which is nonetheless still sufficient, during steady state, to make SAOUT go low. This glitch occurs as follows: Assume all of the memory elements $M_1, \ldots, M_n$, are programmed to a conductive state. When, initially, a large number or all of the select gates $N_1, \ldots, N_n$ are on (i.e., a "strong zero" condition), SAOUT will be low, and the voltage level on line 18 will be very close to that on line 16. However, when the input terms IT1, . . . , ITN change state such that all but one of the select gates are turned-off simultaneously, the current flow through the remaining one conductive memory element at this transition time is below the trip point of sense amplifier 14. This is due to the fact that the voltage difference between lines 16 (RPT) and 18 (VRFY) is very small, and accordingly, a very small current flows. The sense amplifier output SAOUT will switch high momentarily, until current limiting transistor 26, such as device N4, pulls down line 18 to a relatively lower potential (i.e., closer to hard ground), so that enough of a voltage drop is developed across the lone conductive memory element/select gate to support a current flow higher than the trip point of sense amplifier 14. Such a condition is undesirable, and may be unacceptable in certain situations.

Accordingly, there is a need to provide an improved high-speed sense amplifier that eliminates or minimizes one or more of the problems as set forth above.

SUMMARY OF THE INVENTION

It is an object of the present invention to provide an improved sense amplifier that eliminates the above-mentioned "strong zero" to "weak zero" glitch. To achieve this and other objects, and in accordance with the present invention, a high-speed sense amplifier is provided for use with the memory array having a plurality of programmable memory cells arranged in parallel and coupled to a product term line wherein each cell has non-conductive and conductive states. The sense amplifier includes three major elements: biasing and sensing means, generating means, and modulating means. The biasing and sensing means is provided for biasing the product term line to a preselected voltage potential and for sensing when a predetermined current is being drawn from the biasing means through the memory. The generating means is connected to the biasing and sensing means, and, in response to the detection of the predetermined current level, generates an output signal indicating that at least one of the memory cells is in the conductive state. Finally, the modulating means is connected to the product term line and is provided for modulating the predetermined current level (i.e., the "trip" point of the sense amplifier as a whole) according to the number of memory cells that are presently in the conductive state.

In a preferred embodiment, the sense amplifier further includes a current limiting circuit coupled between ground and the memory array for limiting the total current drawn through the memory array. It accomplishes this function by raising the voltage level appearing on a virtual ground line which is coupled to one side of the memory array. As more current flows through the memory array, the increase in the voltage level at the virtual ground line, which effectively decreases the voltage drop across the memory array, tends to offset further increases in total current. The modulating means, which may be a depletion MOS transistor, takes advantage of this increase in the voltage potential of the virtual ground line to modulate the conductivity of the depletion MOS transistor, which is arranged in parallel with the memory array. The modulation of the conductivity varies the current drawn from the biasing circuit of the sense amplifier through the depletion MOS to thereby effectively reduce the predetermined current level (i.e., "trip" level) required of the memory array in order to maintain the sense amplifier output in the proper state. Through use of the modulating circuit, the problem of the "strong zero" to "weak zero" glitch can be eliminated.

Other objects, features and advantages of the present invention will become apparent to one skilled in the art from the following detailed description and the accompanying drawings illustrating features of this invention by way of example, but not by way of limitation.

DETAILED DESCRIPTION OF THE PREFERRED EMBODIMENT

Figure 2:
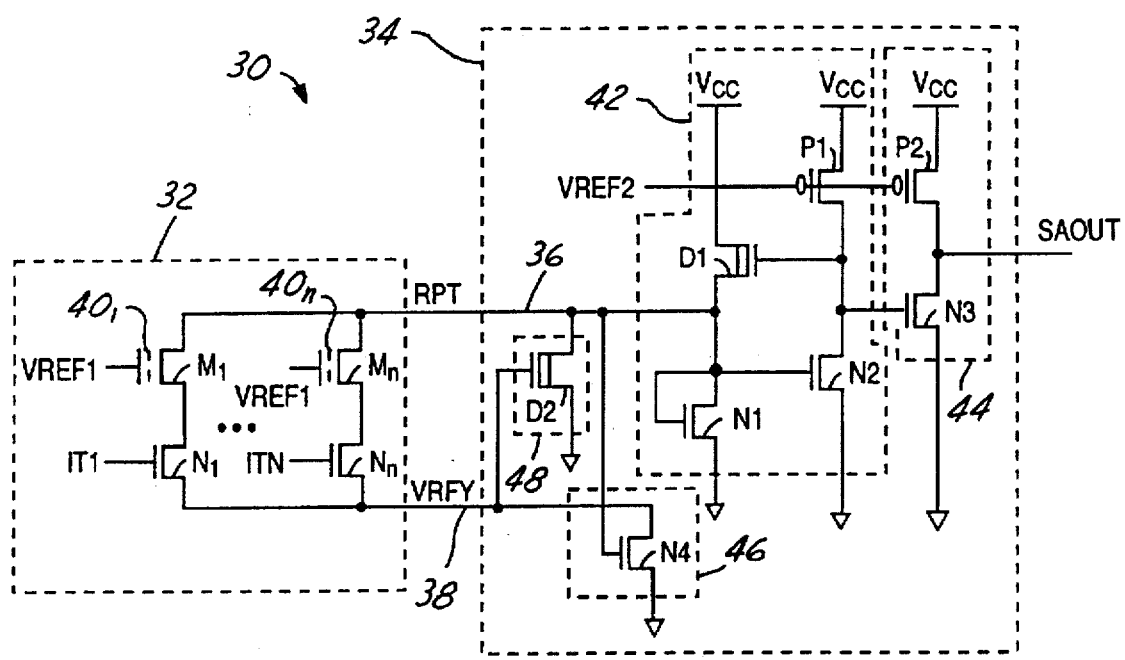
FIG. 2 is a simplified schematic and block diagram view showing an improved sense amplifier embodiment having a variable current level trip point in accordance with the present invention.

Referring now to FIG. 2, a programmable logic device 30 is shown which includes a memory array 32, a transresistance sense amplifier 34 connected to memory array 32 by a read product term (RPT) line 36, and a verify (VRFY) line, which, for purposes of description of the present invention, may be viewed as a virtual ground line 38.

A sense amplifier in accordance with the present invention can be substituted for conventional high-speed sense amplifiers used in small programmable logic devices (PLDs), as well as complex PLDs (CPLDs). A sense amplifier in accordance with this invention provides glitch-free performance without significant compromise in speed or power dissipation. In particular, providing a sense amplifier having a continuously variable trip point depending on the patterns (i.e., variations in what branches are conducting) in the memory array provides the above-mentioned advantages.

Memory array 32 includes a plurality of programmable memory cells $M_1, \ldots, M_n$, and a corresponding plurality of select gates $N_1, \ldots, N_n$. Each memory cell is connected in series with a corresponding select gate to form a branch. The plurality of branches are arranged in parallel and are coupled between the read product term line 36, and the virtual ground line 38. Each of the select gates $N_1, \ldots N_n$ may be an n-channel MOS transistor device, which is turned-on by a respective input term $IT1, \ldots, ITN$, in a manner well-known in the art. Each memory cell $M_1, \ldots, M_n$ includes a respective floating gate $40_1, \ldots, 40_n$ to provide for a conductive or a non-conductive state, depending upon whether the cell has been "programmed." As is conventional in the art, a cell may be programmed by charging its floating gate with electrons in one of several manners known in the art (i.e., via Fowler-Nordheim Tunneling). Once "programmed," a memory cell $M_i$ will not conduct, even when the biasing reference voltage VREF1 is applied to its gate terminal. However, if a memory cell has not been "programmed," the memory cell will provide a conductive path between its drain and source terminals when the gate bias VREF1 is applied thereto. One of ordinary skill in the art should recognize this memory cell as being a part of a programmable logic device, wherein input terms are used to generate product terms.

Sense amplifier 34 is coupled to the memory array by way of lines 36, and 38, and is provided for generating a sense amplifier output signal (SAOUT) indicating that at least one of the plurality of branches containing one of the memory cells $M_1, \ldots, M_n$ is in a conductive state. Of course, non-conductive, and conductive states of each memory cell corresponds to first and second logic states programmed therein. The sense amplifier 34 includes a biasing and sensing circuit 42, an output circuit 44, a current limiting circuit 46, and a current level trip point modulating circuit 48.

Biasing circuit 42 is provided for biasing the RPT line 36 to a preselected voltage potential. In particular, in a preferred embodiment of the present invention, the generated potential is about 1.0–1.2 volts (although this value is dependent on the potential of $V_{cc}$), with a voltage swing of the RPT line 36 being less than about 200 millivolts (i.e., fairly constant). Biasing circuit 42 includes a first depletion MOS transistor device D1, a first n-channel MOS transistor device N1, a second n-channel MOS transistor device N2, and a first p-channel MOS transistor device P1. Biasing voltage reference VREF2 is selected to put transistor P1 in a conductive state. The particular value of VREF2 may be varied somewhat to speedup/slowdown the response time of the sense amplifier. In other words, the voltage applied to the gate of transistor P1 varies the "strength" of the device itself (i.e., "strength" meaning the amount Of current that the device can sink or source, and which is also affected by device geometry, and processing parameters). Device D1 provides a fairly strong pull-up function of the voltage appearing on RPT line 36 towards the positive power supply bus $V_{cc}$. Device N1 is provided for clamping the RPT line 36 when no one of the plurality of branches in memory array 32 are in a conductive state (i.e., are inactive). The combination of device N2 and device P1 provide feedback to the gate of device D1 for maintaining the potential on the RPT line 36 at a substantially constant value.

Output circuit 44 is provided for generating an output signal indicating that at least one of the memory cells is in a conductive state. In particular, circuit 44 includes third n-channel MOS transistor N3, and a second p-channel MOS transistor device P2. Circuit 44 converts the signal appearing on the drain of device N2 to substantially full CMOS levels, which can then be applied to other logic gates.

Current limiting circuit 46, such as fourth n-channel MOS transistor device N4, is coupled between the virtual ground line 38, and a ground power supply bus and is provided for limiting the current drawn from the biasing and sensing circuit 42 through memory array 32. The gate terminal of device N4 is connected to RPT line 36. As described above in the Background section, device N4 causes the potential on the virtual ground line 38 to rise as a function of how much current is being drawn through the memory array 32. In the preferred embodiment, the voltage swing of the line 38 may vary from approximately 0 volts (i.e., ground power supply bus $V_{ss}$) upwards to approximately 1 volt.

An important aspect of this event relates to modulating circuit 48, which is provided for modulating the predetermined current level (i.e., "trip" current level of sense amplifier 34) in accordance with the number of memory cells in the conductive state (i.e., the patterns of programmed memory cells in conjunction with input terms, as applied to select gates), and may include second depletion MOS transistor device D2. The device D2 is provided for drawing current from biasing and sensing circuit 42, in parallel with memory array 32, to thereby effectively reduce the sense amplifier 34 "trip" current level that is required to generate the SAOUT output signal (e.g., a low signal in the disclosed embodiment). That is, device D2 modulates the trip point of sense amplifier 34 by creating an extra current path between the RPT line 36, and the ground power supply bus, the more current flowing through device D2, the lower the trip point of the sense amplifier. In general, the magnitude of the current through device D2, depends on the voltage level appearing on the line 38; the higher the voltage potential on line 38, the stronger the current flow. In general, device D2 may be sized large enough to eliminate the "strong zero" to "weak zero" glitch, but sized not so large as to carry so much current as to adversely effect speed and power.

A description of the operation will now be set forth. As a preliminary matter, it is instructive to get an idea of the magnitude of the current flows. Thus, the total current flowing from biasing and sensing circuit 42 varies, as does the magnitude of the current in any particular branch, due, in part, to the current limiting effect of device N4. For purposes of discussion only, assume that when one branch of memory array 32 conducts, a current of 50 μA may be drawn through the leg. When 5 legs are in a conductive state, assume that each carry 10 μA. When no branch or leg of memory array 32 is in a conductive state, the combination of device D1, and device N1, bias RPT line 36 to such a level as to cause device N2 to conduct thereby tending to pull the gate of device N3 towards ground $V_{ss}$, wherein the output of the sense amplifier SAOUT is pulled-up towards $V_{cc}$ to a logic high state through device P2.

When one of the plurality of branches of memory 32 becomes conductive, the added voltage drop across device D1 causes the voltage potential appearing on the RPT line 36 to begin to dip or decrease. This decrease begins to take device N2 out of the conductive state. However, this action merely increase the voltage potential applied to the gate of device D1 (by way of pull-up device P1), which in turn tends to pull the voltage appearing on the RPT line 36 back up to its initial level. However, the level of current drawn through memory array 32 by the lone conductive branch is sufficient to turn-on device N3, wherein the output of sense amplifier 34, SAOUT, is brought to a low logic state. The magnitude of the current through the single branch, however, is insufficient to appreciably raise the voltage level appearing at virtual ground line 38.

When a large number or all of the branches of the memory array 32 are conducting, the aggregate current therethrough is returned to the ground power supply bus through the channel of device N4. This current is effective to raise the voltage appearing at line 38 substantially. This increased voltage potential is applied to the gate of depletion device D2, which causes an additional amount of current to be drawn from biasing and sensing circuit 42, which is shunted to the ground power supply bus.

Figure 1:
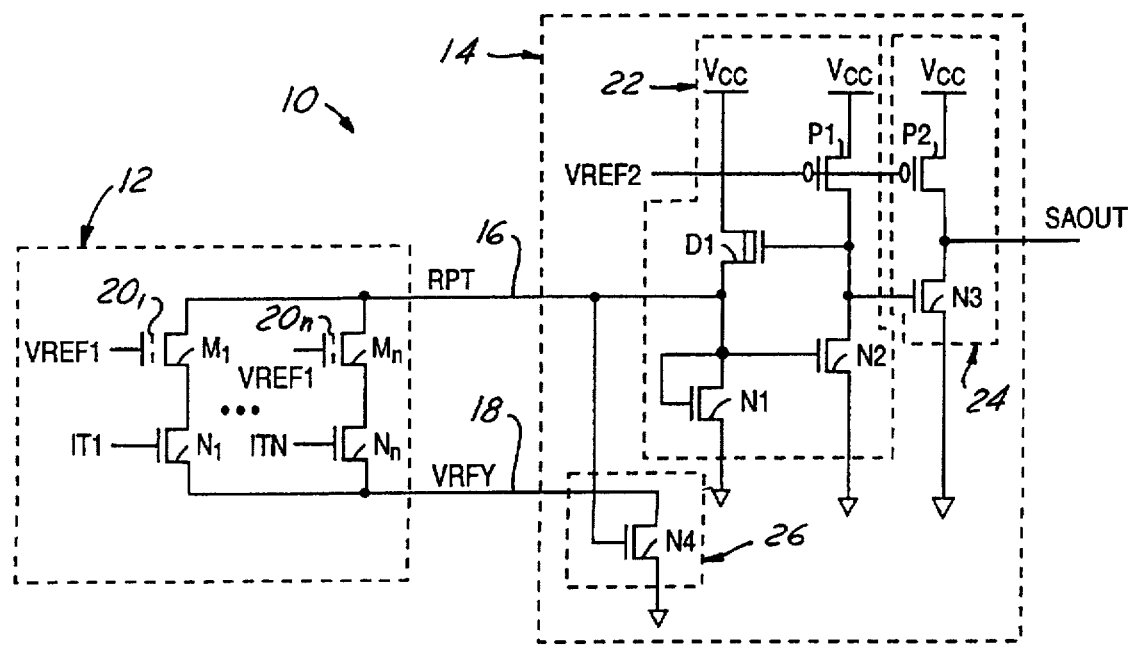
FIG. 1 is a simplified schematic and block diagram view of a conventional logic device, having a memory array, and a two-stage sense amplifier.

In accordance with the present invention, the embodiment illustrated in FIG. 2 will not experience the "strong zero" to "weak zero" glitch. When the large number of branches suddenly changes, due to a change in the states of the input terms IT1, . . . , ITN, to only one conducting branch device D2 maintains sufficient current therethrough to prevent the glitch. In particular, even though the lone branch of memory array 32 that is conducting current carries insufficient current (at least at this transient point in time), in itself, to trip sense amplifier 34, the additional current drawn by device D2, is sufficient to maintain a total current (i.e., through memory 32 and device D2) above the "trip" level of the sense amplifier, thereby maintaining the output SAOUT of the sense amplifier at the correct, low logic state. As the current through device N4 decreases, the voltage potential on line 38 falls close to that of the ground power supply bus, thus re-establishing a sufficient enough voltage drop across memory array 32 to support a current flow higher than the "trip" point of the sense amplifier through the lone conducting branch. Contrast this to the conventional circuit of FIG. 1, where, when many conductive legs change to only one conducting leg, only a very small current (e.g., 10 μA in our example) flow instantaneously. It takes the conventional current a predefined time interval to reestablish the proper one conductive leg current level (e.g., 50 μA in our example).

While the invention has been particularly shown and described with reference to the preferred embodiments thereof, it is well understood by those skilled in the art that various changes and modifications can be made in the invention without departing from the spirit and scope of the invention, which is limited only by the appended claims.

We claim:

1. A sense amplifier for use with a memory array having a plurality of programmable memory cells arranged in parallel and coupled to a product term line wherein each cell has non-conductive and conductive states, comprising:

means for biasing said product term line to a preselected voltage potential;

means coupled to said biasing means for sensing when a predetermined current is being drawn from said biasing means through said memory and generating an output signal indicating that at least one of the memory cells is in a conductive state; and, means coupled to said product term line for modulating said predetermined current level in accordance with the number of memory cells in the conductive state.

2. The sense amplifier of claim 1 wherein said modulating means includes a depletion MOS transistor arranged in parallel with the memory array for drawing current from said biasing means to thereby effectively reduce said predetermined current level required of the memory array to generate said output signal.

3. A sense amplifier for use with a memory array having a plurality of programmable memory cells arranged in parallel and coupled between a read product term line and a virtual ground line wherein each cell has a conductive and a non-conductive state, comprising:

a biasing and sensing circuit for biasing said read product term line to a preselected voltage potential and sensing when a predetermined current is being drawn therefrom through said memory and generating in response thereto a trip signal on an output terminal of said biasing and sensing circuit;

an output circuit having an input terminal coupled to said output terminal of said biasing and sensing circuit and responsive to said trip signal for generating an output signal indicating that at least one of the memory cells is in the conductive state;

a current limiting circuit coupled between the virtual ground line and a ground power supply bus for limiting current drawn from said biasing and sensing circuit through the memory array; and, means coupled to the read product term line for modulating said predetermined current level in accordance with the number of memory cells in the conductive state.

4. The sense amplifier of claim 3 wherein said biasing and sensing circuit includes:

a first depletion MOS transistor having a drain terminal connected to a positive power supply bus $V_{cc}$, a source terminal, and a gate terminal;

a first n-channel MOS transistor having gate and drain terminals connected to said source terminal of said first depletion MOS transistor, said first n-channel MOS further having a source terminal coupled to said ground power supply bus;

a second n-channel MOS transistor having a gate terminal connected to said drain of said first n-channel MOS, a source terminal coupled to said ground power supply bus, and a drain terminal; and, a first p-channel MOS transistor having a source terminal connected to said positive power supply bus $V_{cc}$, a drain terminal connected to said drain terminal of said second n-channel MOS transistor and said gate of said first depletion MOS transistor, and a gate terminal connected to a reference biasing voltage;

wherein said source terminal of said first depletion MOS transistor is connected to said read product term line.

5. The sense amplifier of claim 4 wherein said output circuit includes:

a second p-channel MOS transistor having a source terminal connected to said positive power supply bus $V_{cc}$, a gate terminal connected to said reference biasing voltage, and a drain terminal connected to an output node for generating said output signal; and, a third n-channel MOS transistor having a drain terminal connected to said output node, a source terminal connected to said ground power supply bus, and a gate terminal connected to said drain terminal of said second n-channel MOS transistor.

6. The sense amplifier of claim 5 wherein said current limiting circuit includes:

a fourth n-channel MOS transistor having a source terminal connected to said ground power supply bus, a drain terminal connected to said virtual ground line, and a gate terminal connected to said read product term line.

7. The sense amplifier of claim 6 wherein said modulating means includes:

a second depletion MOS transistor having a gate terminal connected to said virtual ground line, a drain terminal connected to said read product term line, and a source terminal connected to said ground power supply bus.

8. The sense amplifier of claim 3 wherein said modulating means includes:

a depletion MOS transistor having a gate terminal connected to said virtual ground line, a drain terminal connected to said read product term line, and a source terminal connected to said ground power supply bus.

9. A programmable logic device having an improved sense amplifier, comprising:

a memory array having a plurality of programmable memory cells arranged in parallel and coupled between a read product term line and a virtual ground line wherein each cell has a conductive and a non-conductive state corresponding to first and second logic states, respectively;

a sense amplifier coupled to said memory array for generating an output signal indicating that at least one of said memory cells is in said first logic state, said sense amplifier including, a biasing and sensing circuit for biasing said read product term line to a preselected voltage potential and sensing when a predetermined current is being drawn therefrom and generating in response thereto a trip signal on an output terminal of said biasing and sensing circuit;

an output circuit having an input terminal coupled to said output terminal of said biasing and sensing circuit and responsive to said trip signal for generating said output signal;

a current limiting circuit coupled between said virtual ground line and a ground power supply bus for limiting current drawn from said biasing and sensing circuit through said memory array; and, means coupled to said read product term line for modulating said predetermined current level in accordance with the number of memory cells in said first logic state.

10. The logic device of claim 9 wherein each one of said plurality of memory cells is in series with a respective select element disposed between said read product term line and said virtual ground line, each one of said plurality of select elements being placed in a conductive state by a respective input term applied thereto.

11. The logic device of claim 10 wherein said select element is an n-channel MOS transistor.

12. The logic device of claim 9 wherein each memory cell is an electrically-erasable programmable memory cell.

13. The logic device of claim 9 wherein said modulating means includes a depletion MOS transistor having a gate terminal coupled to said virtual ground line, a drain terminal coupled to said read product term line, and a source terminal coupled to said ground power supply bus for drawing current from said biasing means to thereby effectively reduce said predetermined current level required of said memory array to generate said output signal.

* * * * *